United States Patent [19]

Vasile

[11] Patent Number: 5,191,238
[45] Date of Patent: Mar. 2, 1993

[54] DUAL FET CIRCUITS HAVING FLOATING VOLTAGE BIAS

[75] Inventor: Carmine F. Vasile, Medford, N.Y.

[73] Assignee: Grumman Aerospace Corporation, Bethpage, N.Y.

[21] Appl. No.: 620,215

[22] Filed: Nov. 30, 1990

[51] Int. Cl.$^5$ .................... H03K 17/16; H03K 3/35
[52] U.S. Cl. .................... 307/443; 307/450; 307/571; 307/574; 307/284; 307/584
[58] Field of Search ............... 307/443, 450, 571, 574, 307/259, 284, 584, 304

[56] References Cited

U.S. PATENT DOCUMENTS

| | | | |
|---|---|---|---|
| 4,588,243 | 12/1985 | Schutten et al. | 307/584 |
| 4,705,967 | 11/1987 | Vasile | 307/571 |

FOREIGN PATENT DOCUMENTS

| | | | |
|---|---|---|---|
| 2590749 | 5/1987 | France | 307/571 |
| 0149421 | 8/1984 | Japan | 307/584 |

OTHER PUBLICATIONS

*Elektronik* "270W Switching Network With SIPMOS Transistors", No. 11, 4 Jun. 1982.

Primary Examiner—Stanley D. Miller
Assistant Examiner—Margaret Rose Wambach
Attorney, Agent, or Firm—Pollock, VandeSande & Priddy

[57] ABSTRACT

Prior art single FET switches suffer the disadvantage of uncertainties in the turning on and off thereof due to the high back bias voltage required. In the present system, by using a dual FET configuration, with the respective source regions of the FETs connected at a common node and a floating bias voltage source connecting the common node to the respective gate regions of the dual FET, a switching circuit which is capable of handling higher voltages and whose dB compression stays constant is provided. Since the dual FET circuit is symmetrical, depending on the polarity of the biasing voltage, the drain and the source regions are interchangeable.

6 Claims, 5 Drawing Sheets

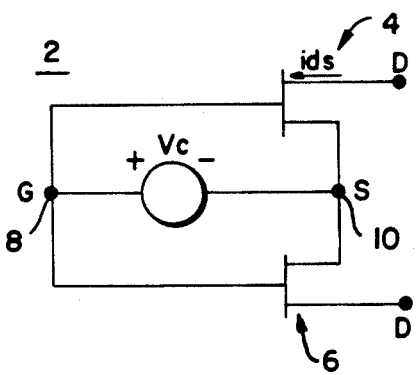
FIG. 1
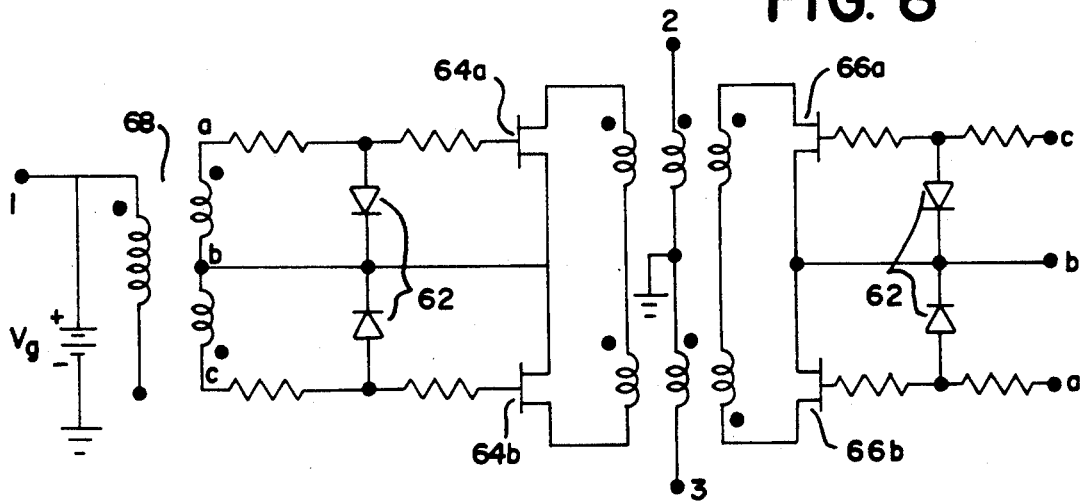
FIG. 7
FIG. 8

SERIES

DUAL FET CIRCUITS HAVING FLOATING VOLTAGE BIAS

FIELD OF THE INVENTION

The present invention relates to transistor circuits and, more particularly, to a floating dual field-effect transistor (FET) circuit with interchangeable source and drain regions.

BACKGROUND OF THE INVENTION

In U.S. Pat. No. 4,705,967 by the same inventor of the instant invention, and incorporated herein by reference, it was disclosed that a FET transistor circuit may be used for balanced circuit configurations such as push-pull amplifiers. Such FET transistor is usually fabricated from gallium arsenide (GaAs) and formed with a metal-semiconductor junction, and referred to as a MESFET. With such a MESFET, the source and drain regions become interchangeable. As was disclosed therein, a graph of the current passing between the source and drain regions shows both positive and negative current flows upon a reversal of excitation voltage and, furthermore, shows that the positive and negative portions of the current to be symmetrical. Thus, reversal of the polarity of the excitation voltage, applied between the source and the drain regions, effectively interchanges the source and drain regions. The dependency of the current on gate-source voltage is the same for both positive and negative current flow.

In the '967 patent, by connecting a balun, preferably in the form of a transformer, at the output of the MESFET transistor, two-way transmission of signals, either from the transistor to the unbalanced terminal, or from the unbalanced terminal to a transistor, is achieved, thereby effecting a balanced configuration. Although the circuit of the '967 patent works well for balanced circuits, it was found that for other circuits such as switches, mixers, power amplifiers and modulators where enhanced performance is required, a different type of circuit is needed.

SUMMARY OF THE INVENTION

To provide for the added performance and to extend the versatility of a FET switch, a dual MESFET circuit which has two FETs interconnected at their respective source regions with a floating voltage source connected to the commonly connected source regions and the respective gate regions of the FETs is envisioned. By thus connecting the respective source regions of the FETs, the dual FET switch circuit provides for a symmetrical structure having a dB compression that is linear and enhanced power handling characteristics.

It is therefore an objective of the present invention to provide a dual FET switch circuit which utilizes the symmetrical characteristics of a MESFET to provide a circuit that has enhanced performance for balanced circuit operation.

An advantage of the present invention circuit resides in the versatility which allows it to be incorporated into circuitries, among which include switches, mixers, power amplifiers and modulators.

BRIEF DESCRIPTION OF THE DRAWINGS

The aforementioned objectives and advantages of the present invention are explained in the following description, taken in connection with the accompanying drawings, wherein:

FIG. 1 is a schematic of the circuit of the present invention;

FIG. 7 is an equivalent schematic of the FIG. 1 circuit; and

FIG. 8 is a schematic of a push-pull triple balanced mixer circuit which utilizes the FIG. 1 circuit of the present invention.

DETAILED DESCRIPTION OF THE PRESENT INVENTION

Referring to FIG. 1, there is shown an electrical circuit constructed in order to provide symmetrical voltage-current characteristics. Specifically, circuit 2 has two FET transistors 4 and 6 which operate symmetrically irrespective of whether the current flow is positive or negative. To form the dual FET circuit, the respective source regions of transistors 4 and 6 are commonly connected. Further connected to the commonly connected source regions is a negative end of a floating voltage source $V_c$, whose positive end is connected to a common node 8 to which the respective gate regions of transistors 4 and 6 are also connected. Thus, in essence, the FIG. 1 circuit has two FETs connected in series at their respective source regions, with a voltage source connected between the gate and the source of the circuit to provide proper biasing. The dual FET configuration is made of MESFETs fabricated on a layer substrate such as GaAs which provides for symmetrical drains and sources.

Since the FET transistors are symmetrical, the drain and source regions of the transistors are interchangeable. In other words, node 10 becomes the source of the series connected dual FET circuit if it is negatively biased. Conversely, if positively biased, node 10 becomes the drain of the dual FET circuit, thereby effecting a totally symmetrical switch. And since the symmetrical switch can handle a higher voltage, the performance of a circuit incorporating the FIG. 1 switching circuit is enhanced.

The differences, in terms of voltage and current, between a conventional common source circuit utilizing a FET and the dual FET circuit of the present invention are given hereinbelow with respect to FIGS. 2a, 2b, 3a and 3b.

Figure 2A:
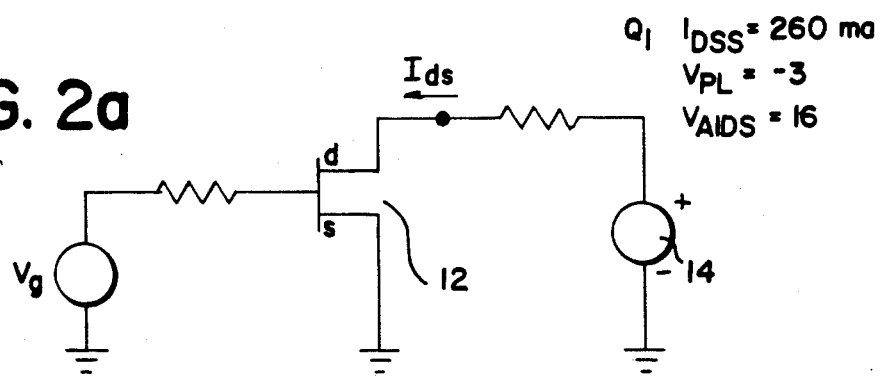
FIG. 2a is a prior art shunt switching circuit.
Figure 3A:
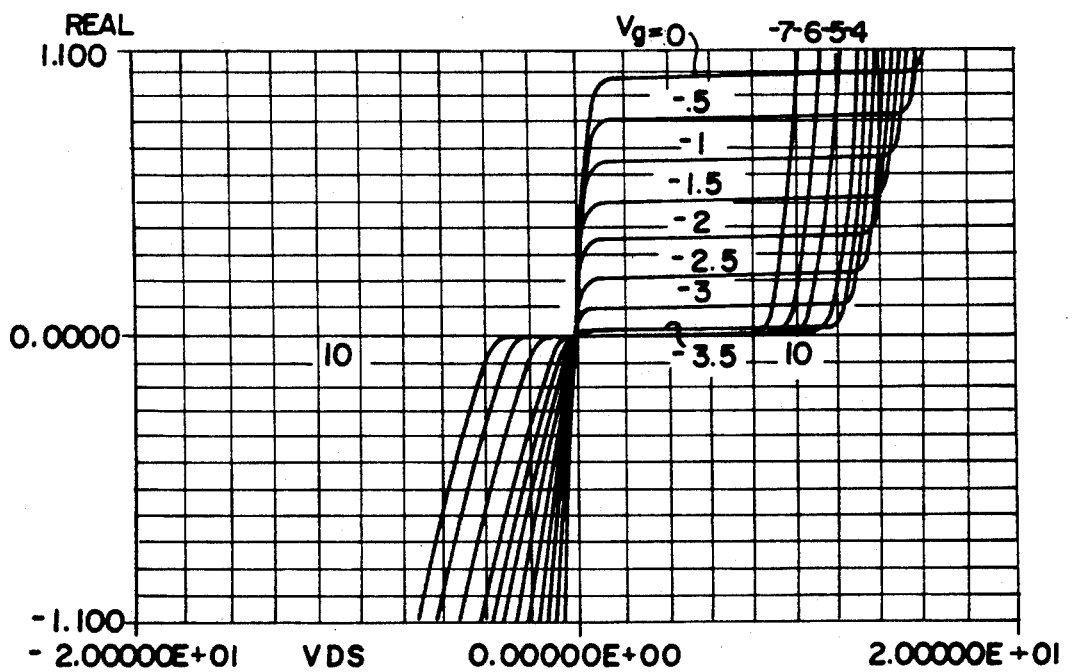
FIG. 3a is a diagram showing the current-voltage curves of the FIG. 2a circuit.

A common source circuit using a conventional FET for a switch is shown in FIG. 2a as having a voltage source $V_g$ to provide back bias for a FET 12. A voltage source 14 provides biasing for the drain region of FET 12. The current-voltage (I-V) characteristics of the FIG. 2a common source circuit is shown in FIG. 3a where it can further be seen that the common source switch of FIG. 2a provides for good switching characteristics in the upper right hand quadrant, for various back biasing voltages.

Figure 2B:
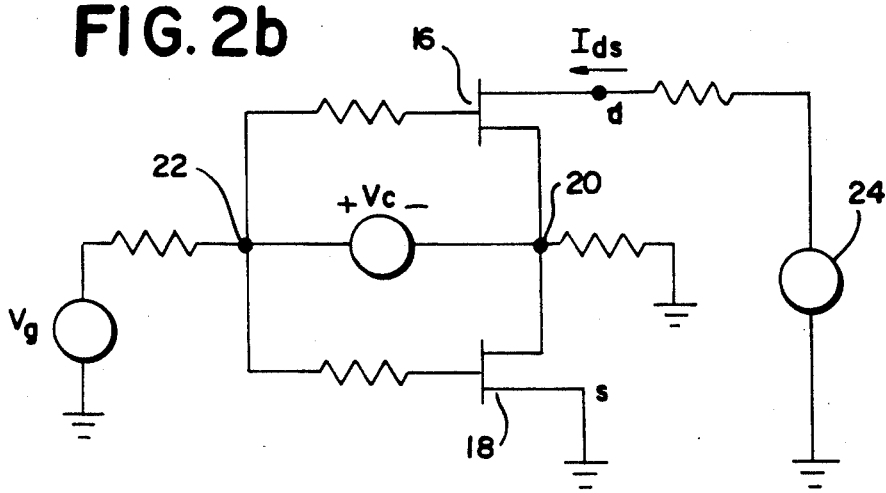
FIG. 2b is a shunt switching circuit which utilizes the circuit of the instant invention.

The FIG. 2b circuit has a pair of FETs 16 and 18 the respective source regions of which being connected at node 20. A voltage source $V_c$ is connected between node 20 and a common node 22. The respective gate regions of FETs 16 and 18 are also connected to node 22. For back biasing, a voltage source $V_g$, similar to that of the FIG. 2a circuit, is provided. Likewise, a voltage source 24 provides biasing to the drain region of FET 16.

Figure 3B:
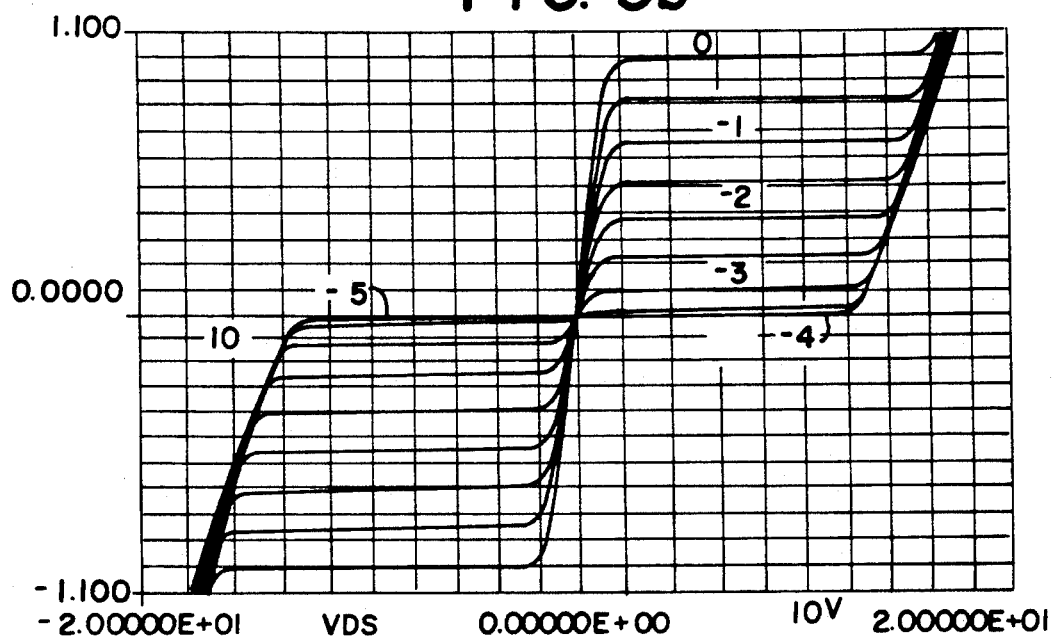
FIG. 3b is a diagram of the current-voltage curves of the FIG. 2b circuit.

Unlike those of the FIG. 2a circuit, the I-V characteristics of the FIG. 2b circuit, as shown in FIG. 3b, are symmetrical—that is, the I-V characteristics in the upper right quadrant is a mirror image of those shown in the lower left hand quadrant. Given this symmetry, the FIG. 2b circuit can be driven at a transistor-transistor-logic (TTL) level since it requires only a potential voltage of approximately between 2 to 4 volts. Consequently, such circuit is capable of handling much higher power than the common source circuit of FIG. 2a, which typically requires approximately 8 volts in order to be driven.

Circuits which show more clearly the improvement of the present invention dual FET circuit over the conventional single FET circuit are shown in FIGS. 4a, 4b and 5a, 5b.

Figure 4A:
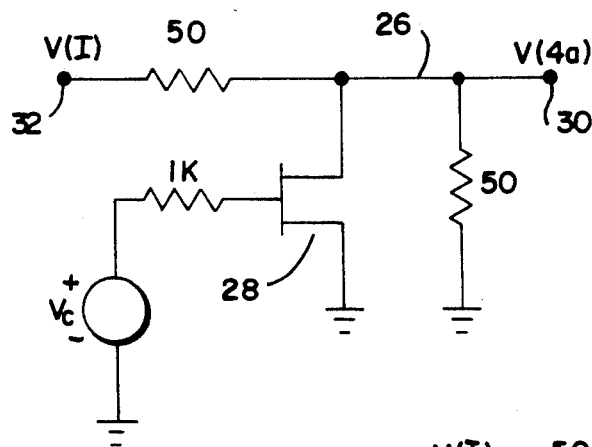
FIG. 4a is a schematic of a prior art shunt circuit.
Figure 6A:
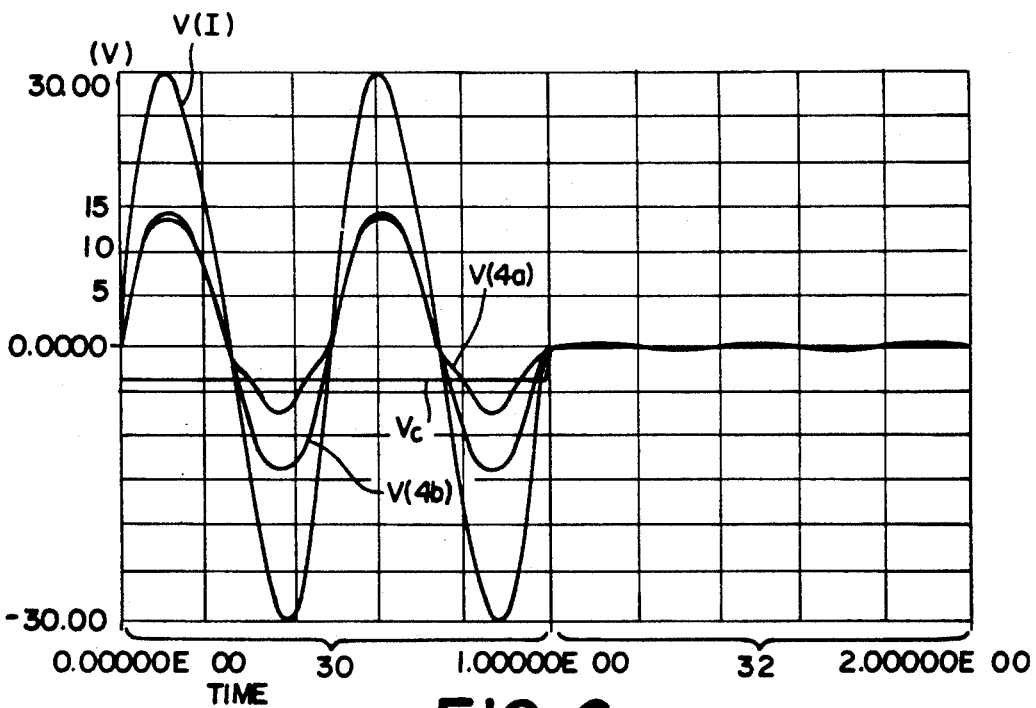
FIG. 6a is a current-voltage diagram illustrating the sinusoidal voltage waveforms at different points for the circuits of FIGS. 4a and 4b.

A conventional FET shunt circuit is shown in FIG. 4a. The I-V characteristics of the FIG. 4a circuit is illustrated in FIG. 6a. For the FIG. 4a circuit, switching depends on whether line 26 is positively or negatively biased. Thus, a very high back bias voltage is required in order to keep switch 28 from turning on when it is off, as in the case when line 26 becomes negative. Therefore, the operating range of the FIG. 4a circuit is limited. In addition, in order to drive such circuit, a high back bias voltage of approximately 8 volts is required for $V_c$.

Referring to FIG. 6a, it can be seen that the input voltage, designated V(I), is a sinusoidal waveform when switch 28 is open, during time 30. When 28 is closed, as during time 32, since the circuit is a shunt circuit, no input voltage is shown. At node 30, i.e. the output of the FIG. 4a switching circuit, it can be seen that the FIG. 4a circuit provides for a waveform, designated V(4a), which is severely distorted, especially where the voltage is negative.

Figure 4B:
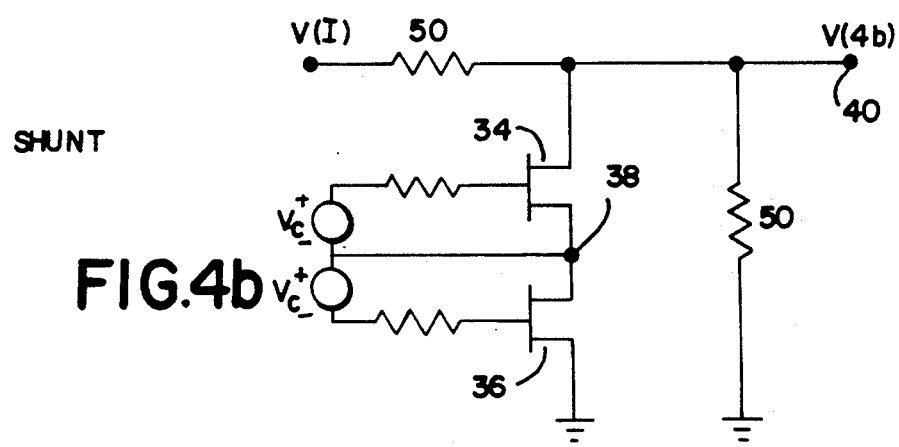
FIG. 4b shows a shunt circuit using the circuit of the present invention.

A switching circuit which utilizes the dual FET circuit of the instant invention is shown in FIG. 4b. There, it can be seen that FET transistors 34 and 36 are connected, at a common node 38, by means of their respective source regions. The respective gates of FETs 34 and 36 are biased by separate voltage sources $V_c$. Also, resistors respectively connect the drain region of FET 34 to the input voltage V(I) and ground to form a shunt switching circuit. It should be appreciated that voltage sources $V_c$ can be replaced by a single voltage source. With the circuit configuration of FIG. 4b, since the dual FET configuration is symmetrical, the FIG. 4b circuit can be driven at TTL level since it requires a potential voltage of approximately between 2 to 4 volts. In FIG. 6a, a waveform V(4b), measured at output node 40 of the FIG. 4b switching circuit, illustrates an almost perfect switch having minimum inherent distortion and wide dynamic range.

Figure 5A:
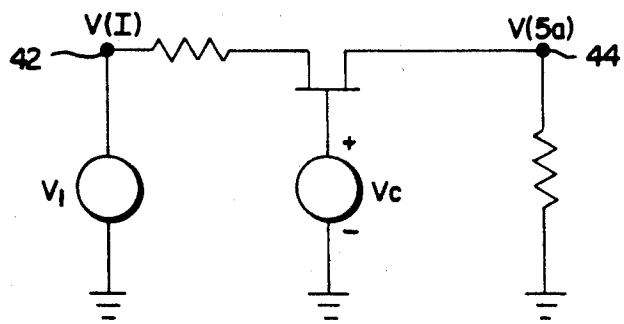
FIG. 5a is a conventional FET in-series circuit.
Figure 6B:
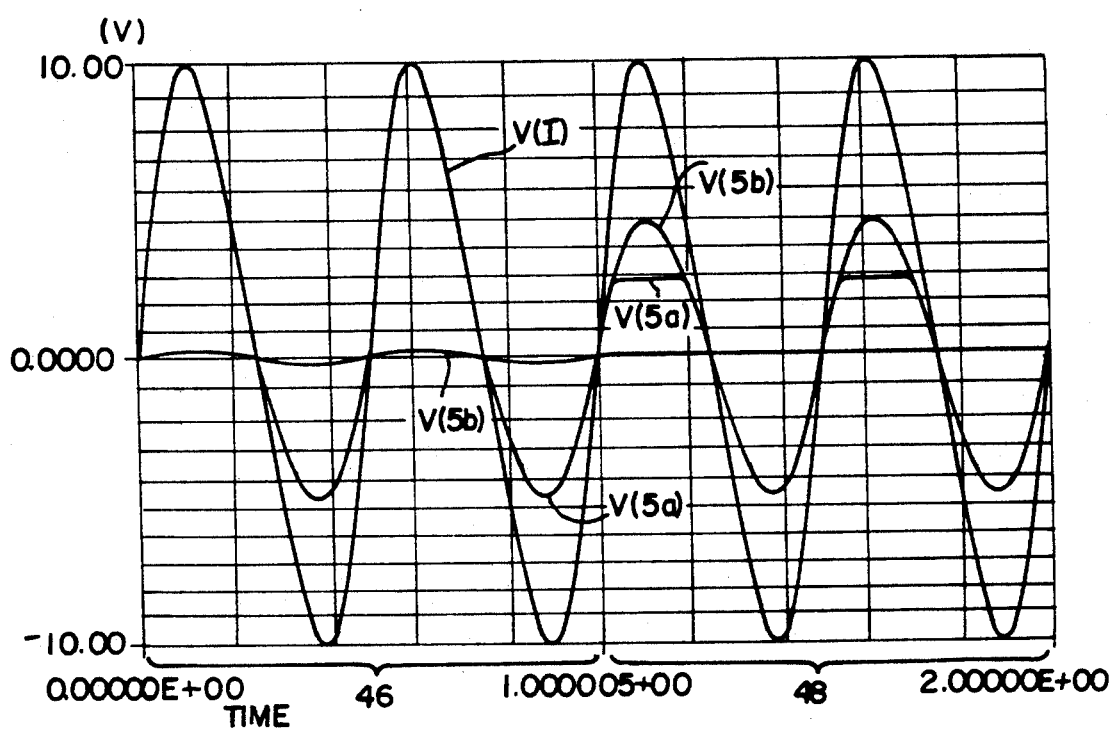
FIG. 6b is a diagram showing the different voltage waveforms of the FIGS. 5a and 5b circuits.

For a conventional series switch such as that shown in FIG. 5a wherein an input is provided at node 42 and an output is measured at node 44, with reference to FIGS. 6b, it can be seen that with an input voltage V(I), the output waveform V(5a) at node 44 of the FIG. 5a a circuit has a negative sinusoidal waveform when the FIG. 5a switch is off at time 46 and a truncated positive waveform when the FIG. 5a switch is switched on at time 48. Thus, the common source series circuit of FIG. 5a provides for a switch which remains responsive to a negative input when it is supposedly turned off; and while it is on, has a clipped output.

Figure 5B:
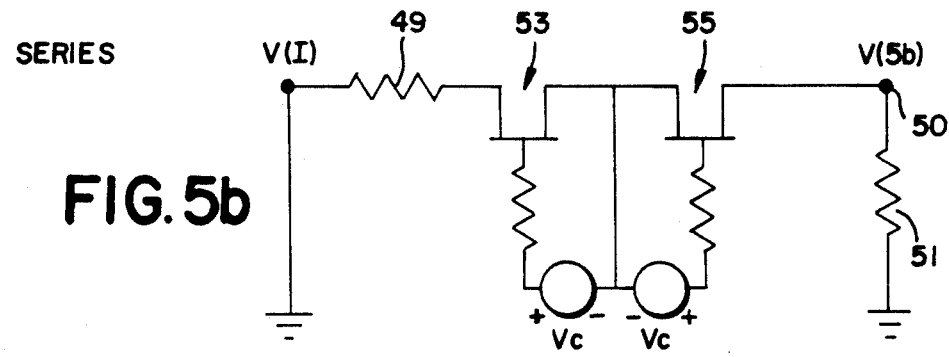
FIG. 5b shows an in-series circuit using the circuit of the present invention.

The FIG. 5b circuit utilizes the dual FET configuration of the present invention by connecting the drain region of FET 53 to the input voltage V(I) via resistor 49 and grounding one end of resistor 51 so that an output is provided at the drain region of FET 50, at node 50. Again referring to FIG. 6b, it can be seen that the output voltage V(5b) at node 50 does not turn on during time period 46 when the circuit is off and thus provides a perfect switch which essentially follows the sinusoidal input waveform during time period 48. Therefore, it should be appreciated that a switching circuit, be it shunt or in-series, that is comprised of the dual FET circuit of the present invention has improved switching characteristics than conventional switching circuits.

Instead of the voltage source $V_c$, the dual FET circuit can also be biased by means of a transformer, such as 52 shown in FIG. 7, which has a primary and secondary section, the secondary section having two legs each of which is connected to a corresponding one of the gates of the FETs. Transformer 52 further has a center tap connected to the commonly connected source region of the FETs. The optional resistors such as 54 and diodes 56 provide protection for FETs 58 and 60. The circuit in FIG. 7, and its obvious derivatives, can be used in high voltage, fast "crow-bar", single pole double throw (SPDT) or series switching circuits.

Moreover, the dual FET circuit of the present invention can be incorporated into other circuits such as the high level switching mixer circuit shown in FIG. 8. Again, diodes 62 provide protection transistors 64a, 64b and 66a and 66b. As the operational characteristics of such push-pull balanced mixer circuit is well known, no discussion thereof is deemed necessary, aside from the fact that a transformer 68 is used to bias FET 64a and 64b and a local oscillator signal is required as input to the circuit.

Inasmuch as the present invention is subject to many variations, modifications and changes in detail, it is intended that all matter described throughout this specification and shown in the accompanying drawings be interpreted as illustrative only and not in a limiting sense. Accordingly, it is intended that the invention be limited only by the spirit and scope of the appended claims.

I claim:
1. A self-biasing switching circuit comprising:
two FETs each having a first, second and gate terminal, respective first terminals of said FETs being connected as a common terminal to form a dual FET, said dual FET having symmetrical source and drain characteristics permitting interchanging said common and respective second terminals of said FETs as a function of the voltages between said common terminal and said gate terminals;

floating voltage means having one end connected to said common terminal and another end connected to respective gate terminals of said FETs to provide proper biasing for said FETs, said floating voltage means including a transformer having a primary section and a secondary section, said secondary section having two legs each connected to one of said gate terminals and a center tap connected to said common terminal;

a diode connecting each leg of said secondary section to said center tap to provide protection for the circuit; and a plurality of series connected diodes connecting the input of said primary section to ground to provide biasing for the circuit.

2. The circuit of claim 1, wherein each of said FETs comprises a field effect transistor constructed of gallium arsenide with a metal-semiconductor interface.

3. A circuit comprising:

two FETs each having a first, second and gate terminal, respective first terminals of said FETs being connected as a common terminal to form a dual FET, said dual FET having symmetrical source and drain characteristics permitting interchanging said common and respective second terminals of said FETs as a function of the voltages between said common terminal and said gate terminals;

floating voltage means having one end connected to said common terminal and another end connected to respective gate terminals of said FETs to provide proper biasing for said FETs, wherein said gate terminals are connected in common; and wherein said floating voltage means comprises two voltage sources each connected to said common terminal and said gate terminal of a respective one of said FETs to effect a switching circuit.

4. A switching circuit comprising:

a dual FET including two FETs each having a source, drain and gate terminal, respective source terminals of said FETs being connected together, said dual FET having symmetrical source and drain characteristics permitting interchanging said source terminals and respective drain terminals as a function of voltages between said source terminals and respective gate terminals of said FETs; and a floating voltage means having one end connected to each of said gate terminals and another and connected to said connected together source terminals;

wherein, due to the symmetrical source and drain characteristics of said dual FET, a switching circuit having minimum inherent distortion and wide dynamic range is effected; and wherein said floating voltage means comprises a first and second voltage source each having a first end connected to said connected together source terminals and a second end connected to a corresponding one of said respective gate terminals of said FETs, said respective first ends of said first and second voltage sources being connected to said source terminals having the same voltage.

5. The switching circuit of claim 4, further comprising:

one resistor having one end connected to one of said drain terminals of said dual FET; and another resistor having one end connected to said one drain terminal of said dual FET to which said first resistor is connected, the other end of said another resistor being grounded to form a shunt switch having an input provided by the other end of said one resistor and an output provided across said another resistor.

6. The switching circuit of claim 4, further comprising:

one resistor having one end connected to one of said drain terminals of said dual FET;

another resistor having one end connected to the other one of said drain terminals of said dual FET and the other end connected to ground to effect a series switch having an input provided by the other end of said one resistor and an output provided across said another resistor.

* * * * *

UNITED STATES PATENT AND TRADEMARK OFFICE
CERTIFICATE OF CORRECTION

PATENT NO. : 5,191,238
DATED : March 2, 1993
INVENTOR(S) : Carmine F. Vasile It is certified that error appears in the above-identified patent and that said Letters Patent is hereby corrected as shown below:

Column 4, line 44, after "protection" insert --for FET--.

Column 6, line 6, change "and" (second occurrence) to

--end--.

Signed and Sealed this

Twenty-third Day of November, 1993

Attest:

BRUCE LEHMAN

*Attesting Officer*   *Commissioner of Patents and Trademarks*